(12) United States Patent
Gehring et al.

(10) Patent No.: US 7,642,845 B2
(45) Date of Patent: Jan. 5, 2010

(54) CIRCUIT FOR CREATING TRACKING TRANSCONDUCTORS OF DIFFERENT TYPES

(75) Inventors: Mark R. Gehring, Portland, OR (US); Joseph Stenger, North Plains, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 201 days.

(21) Appl. No.: 11/467,067

(22) Filed: Aug. 24, 2006

(65) Prior Publication Data

US 2007/0046368 A1 Mar. 1, 2007

Related U.S. Application Data

(60) Provisional application No. 60/711,823, filed on Aug. 26, 2005.

(51) Int. Cl.
*G01R 19/00* (2006.01)
(52) U.S. Cl. .......................... 330/2; 330/305; 327/553; 327/552
(58) Field of Classification Search ............ 330/2, 330/305; 327/552, 553
See application file for complete search history.

(56) References Cited

U.S. PATENT DOCUMENTS

| 4,064,506 | A | * | 12/1977 | Cartwright, Jr. | ............. 341/135 |
| 5,912,583 | A | * | 6/1999 | Pierson et al. | ............. 327/553 |
| 5,933,054 | A | | 8/1999 | Kimura | |
| 6,147,550 | A | | 11/2000 | Holloway | |
| 6,538,498 | B2 | * | 3/2003 | Lee et al. | ............. 327/553 |
| 6,559,720 | B1 | | 5/2003 | Huijsing et al. | |
| 6,933,773 | B2 | | 8/2005 | Mattsson et al. | |
| 7,078,960 | B2 | * | 7/2006 | Ezell | ............. 327/553 |
| 7,250,819 | B2 | * | 7/2007 | Kelly et al. | ............. 330/257 |
| 7,265,609 | B2 | * | 9/2007 | Hughes | ............. 327/553 |
| 2004/0140853 | A1 | | 7/2004 | Cyrusian | |

OTHER PUBLICATIONS

USPTO; PCT International Search Report and Written Opinion PCT/US06/33591; Mar. 14, 2008; 6 Pages.

* cited by examiner

*Primary Examiner*—Patricia Nguyen

(57) ABSTRACT

Systems and method for tracking different types of transconductance cells is shown and described. In these multi-cell systems, the addition of one or more tracking control modules allows circuit designers to advantageously incorporate multiple transconductor topologies and their uniquely beneficial characteristics into their designs, without eradicating its centralized multi-cell tuning functionality.

18 Claims, 5 Drawing Sheets

CIRCUIT FOR CREATING TRACKING TRANSCONDUCTORS OF DIFFERENT TYPES

REFERENCE TO RELATED APPLICATIONS

This application claims priority from U.S. Provisional Application No. 60/711,823, filed Aug. 26, 2005, which is incorporated herein by reference.

FIELD OF THE INVENTION

This invention relates generally to transconductance cells, and more specifically to tracking different types of transconductors within multi-cell systems.

BACKGROUND OF THE INVENTION

Transconductance cells are typically employed as building blocks in the design of complex electronic circuits, or systems. There are many types of transconductance cells available to circuit designers, each with different characteristics and topologies. Some of the desirable characteristics of transconductance cells are low noise, low power consumption, linearity, and size. As is common in circuit design, however, transconductance cells with topologies that optimize one characteristic may be degrade one or more of the other characteristics. For example, a transconductance cell configured for low power consumption may have worse linearity than a cell configured for higher power consumption.

Systems that include multiple transconductance cells, such as filters, typically use the same topology for all of their cells throughout their design. This uniformity in cell type ensures that the transconductance cells track each other when adjusted with a common bias voltage or current. FIG. 1 shows a typical system of transconductance cells 100. Referring to FIG. 1, the system 100 includes a plurality of transconductance (gm) cells 120-1 to 120-N. The gm cells 120-1 to 120-N are the same type, i.e., they have the same topology or configuration, and thus track each other when adjusted by a common bias voltage 112 (or current).

A transconductor tuning loop 110 generates and provides the common bias voltage 112 to each of the gm cells 120-1 to 120-N. The transconductor tuning loop 110 generates the common bias voltage 112 by adjusting the transconductance of a tuning gm cell 111 with the same topology as the gm cells 120-1 to 120-N. Once adjusted, the gm cells 120-1 to 120-N track the tuning gm cell 111. Although system 100 has the advantage of tracking all of the transconductance cells 120-1 to 120-N with a common tuning loop 110, the use of a single cell-topology limits the ability of designers to advantageously incorporate and track differing cell types into their designs.

DESCRIPTION OF THE DRAWINGS

The invention may be best understood by reading the disclosure with reference to the drawings.

DETAILED DESCRIPTION

In systems with multiple transconductance cells, such as filters, the ability to centrally tune all of the cells so they track each other is advantageous. As described above, prior multi-cell systems centrally tune their cells with a common bias voltage or current. This approach, however, requires all of the cells to have the same topology, which does not allow designers the ability to advantageously incorporate transconductance cells with different characteristics into their systems, as their varying cell-topologies will not track according to a common bias. The addition of one or more tracking control modules to a multi-cell system, however, adjusts the common bias so that it supports transconductance cells with different cell-topologies, thus giving system designers the freedom to introduce different cell types into its design without losing the ability to centrally tune the system. Embodiments of the present invention will now be described in more detail.

Figure 1:
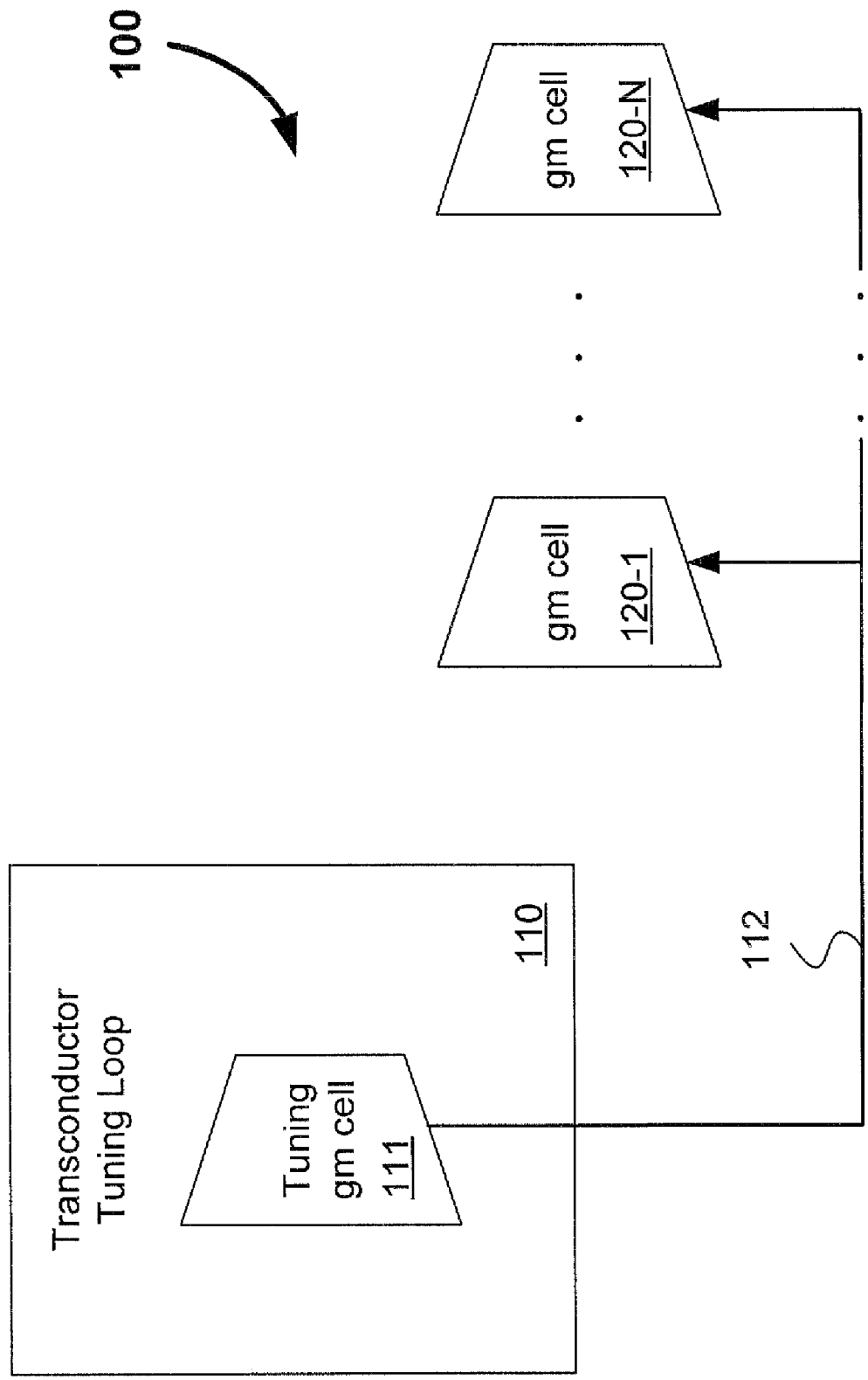
FIG. 1 shows a conventional system of transconductance cells.
Figure 2:
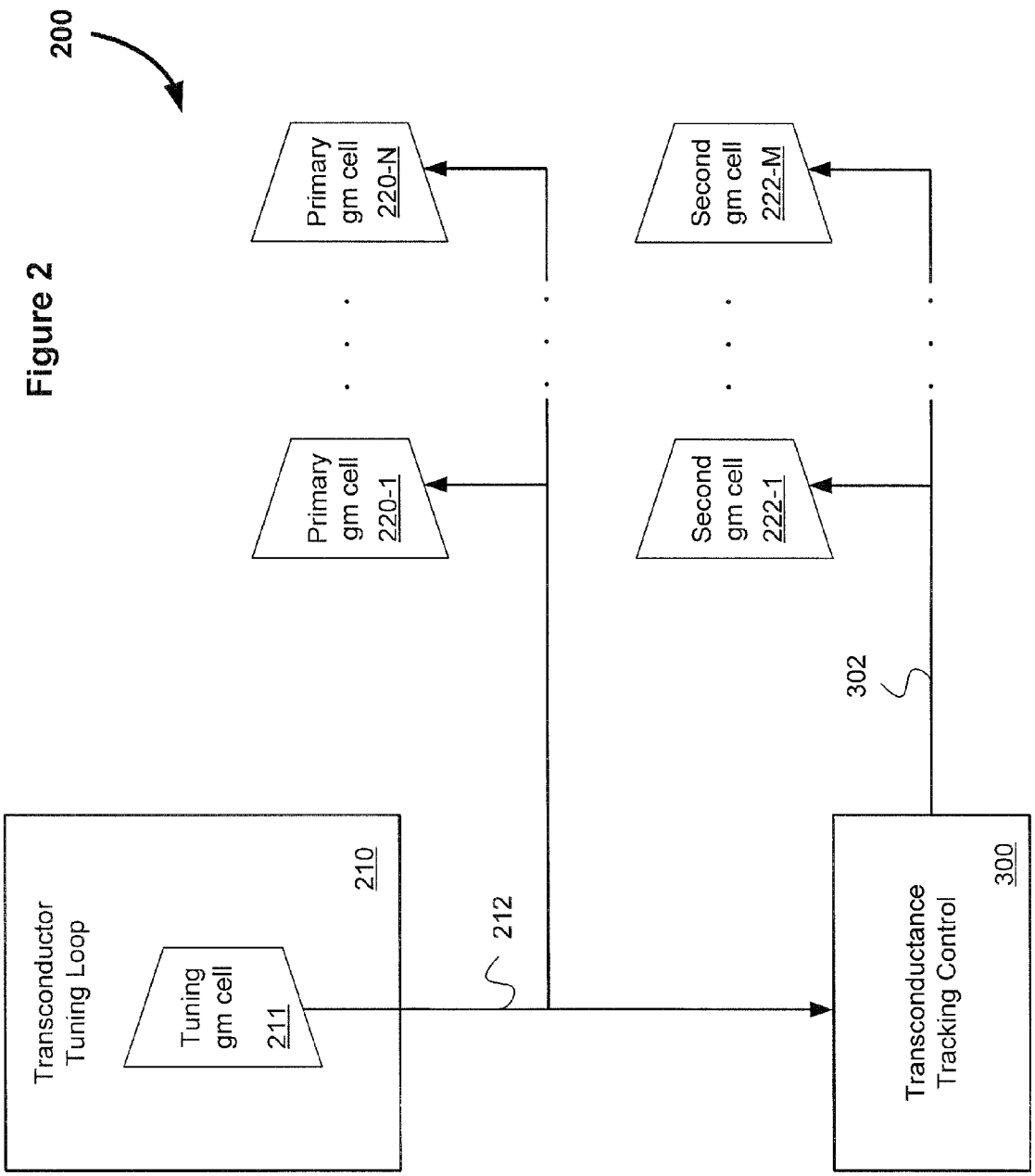
FIG. 2 illustrates, in block form, a system of transconductance cells useful with embodiments of the present invention.

FIG. 2 illustrates, in block form, a system of transconductance cells 200 useful with embodiments of the present invention. Referring to FIG. 2, the system 200 includes two different transconductance (gm) cell types, primary gm cells 220-1 to 220-N and secondary gm cells 222-1 to 222-M. The primary gm cells 220-1 to 220-N each have the same or similar topology, so they may track each other when provided a primary bias 212. The secondary gm cells 222-1 to 222-M also share a common or similar topology and may track each other when provided a secondary bias 302. The primary bias 212 adjusts the transconductance value of the primary gm cells 220-1 to 220-N, while the secondary bias 302 adjusts the transconductance value of the secondary gm cells 222-1 to 222-M. When the primary and secondary cells 220-1 to 220-N and 222-1 to 222-M track each other, their transconductance values are adjusted to substantially the same setting. The primary bias 212 and secondary bias 302 may be voltages or currents, depending on the configurations of the primary gm cells 220-1 to 220-N and the secondary gm cells 222-1 to 222-M, respectively.

A transconductor tuning loop 210 generates the primary bias 212 according to processing variations of the system 200, and provides the primary bias 212 to each of the primary gm cells 220-1 to 220-N and a transconductance tracking control 300. The transconductor tuning loop 210 may include a tuning gm cell 211 that has the same or similar topology as the primary gm cells 220-1 to 220-N. When tuning the gm cells 220-1 to 220-N and 222-1 to 222-M in the system 200, the transconductor tuning loop 210 adjusts the tuning gm cell 211 to generate the primary bias 212. Since the primary gm cells 220-1 to 220-N and the tuning gm cell 211 have the same or similar topology, the primary bias 212 is used to directly adjust the primary gm cells 220-1 to 220-N. Since the secondary gm cells 222-1 to 222-M may have a different topology than the primary gm cells 220-1 to 220-N and the tuning gm cell 211, providing the primary bias 212 directly to the secondary cells 222-1 to 222-M can cause an adjustment to the secondary cells 222-1 to 222-M that does not track with the primary cells 220-1 to 220-N.

The system 200 includes a transconductance tracking control 300 to generate the secondary bias 302 responsive to the primary bias 212, and to provide the secondary bias 302 to the secondary gm cells 222-1 to 222-M. The secondary bias 302 may be a modified version of the primary bias 212, which allows the secondary gm cells 222-1 to 222-M to be adjusted to track the primary gm cells 220-1 to 220-N. Embodiments of the transconductance tracking control 300 will be described below in greater detail with reference to FIG. 3. The system 200 therefore may centrally tune gm cells with varying topologies, e.g., primary cells 220-1 to 220-N and secondary gm cells 222-1 to 222-M, thus allowing system designers to strategically incorporate differing gm cell types into their designs.

Figure 3A:
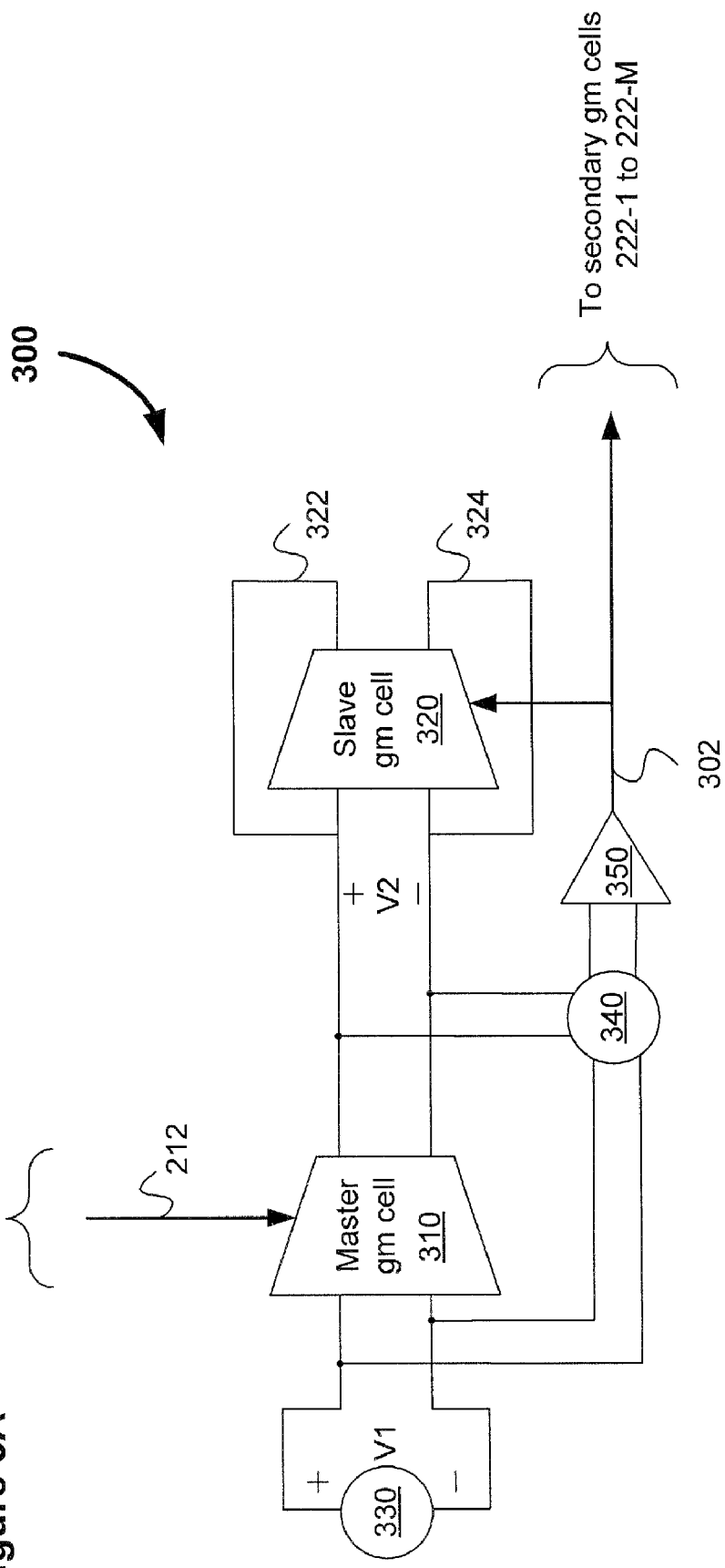
FIG. 3A-3B illustrates, in block form, embodiments of the transconductance tracking control shown in FIG. 2.
Figure 3B:
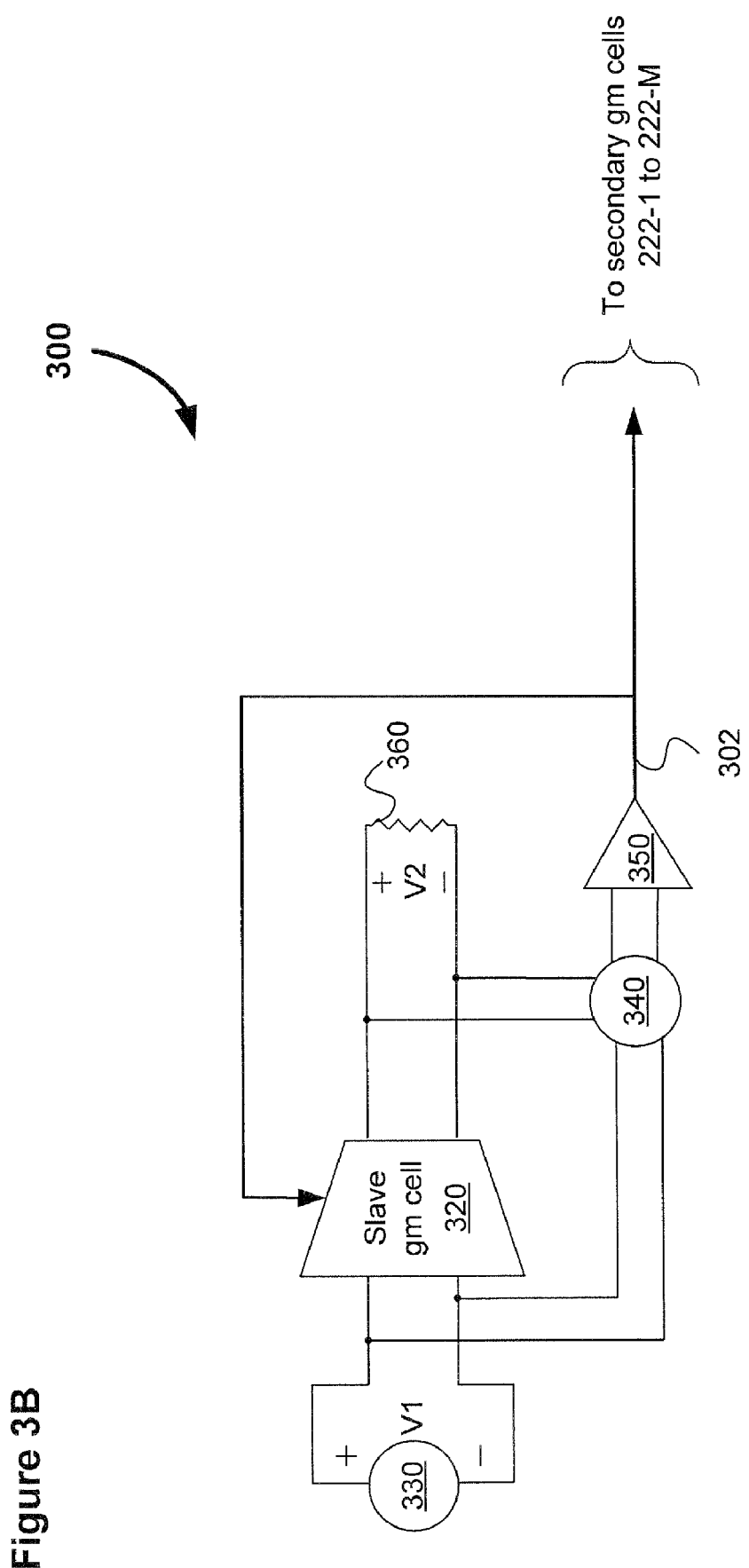

FIGS. 3A and 3B illustrate, in block form, embodiments of the transconductance tracking control 300 shown in FIG. 2. Referring to FIG. 3A, the transconductance tracking control 300 includes a master gm cell 310 and a slave gm cell 320. The master gm cell 310 may have the same or similar topology as the primary gm cells 220-1 to 220-N (FIG. 2) and the tuning gm cell 211 (FIG. 2), while the slave gm cell 320 may have the same or similar topology as the secondary gm cells 222-1 to 222-M (FIG. 2). In some embodiments, the master gm cell 310 and the slave gm cell 320 may be interchangeable, where the master gm cell 310 may have the same or similar topology as the secondary gm cells 222-1 to 222-M (FIG. 2), while the slave cm cell 320 may have the same or similar topology as the primary gm cells 220-1 to 220-N (FIG. 2) and the tuning gm cell 211 (FIG. 2).

The master gm cell 310 receives a differential voltage $V_1$ from a voltage source 330, and its transconductance value (gm1) is directly tuned according to the primary bias 212 from the transconductor tuning loop 210 (FIG. 2). The slave gm cell 320 is configured with negative feedback loops 322 and 324, which causes it to act like a resistor with a value equal to the inverse of its transconductance value (gm2).

As shown below in Equation 1, the voltage $V_2$ across the slave gm cell 320 is equal to the voltage $V_1$ of voltage source 330 multiplied by the transconductance of the master gm cell 310 and the inverse of the transconductance of the slave gm cell 320, where the master and slave gm cells 310 and 320 are linear over the voltage range of $V_1$ and $V_2$.

$$V_2 = \frac{V_1(gm1)}{gm2} \quad \text{Equation 1}$$

When the voltages $V_1$ and $V_2$ are equal the transconductance value (gm2) of the slave cell 320 is equal to the transconductance value (gm1) of the master cell 310.

The transconductance tracking control 300 includes a difference unit 340 to determine the difference between the two voltages $V_1$ and $V_2$ and an operational amplifier (op-amp) 350 to generate the secondary bias 302 according to the determined difference. When the secondary bias 302 is a current, the use of op amp 350 may be optional. The secondary bias 302 can adjust the transconductance values of the slave gm cell 320 and the secondary gm cells 222-1 to 222-M (FIG. 2) to track the transconductance values of the master gm cell 310 and the primary gm cells 220-1 to 220-N (FIG. 2).

Referring to FIG. 3B, another embodiment of the transconductance tracking control 300 may include a slave gm cell 320 and a resistor 360. The resistor 360 may have a resistive value substantially equal to the inverse of the transconductance value (gm2) associated with the secondary gm cell 222-1 to 222-M (FIG. 2).

During an initial configuration or testing of the transconductance tracking control 300, the resistive value of the resistor 360 may be measured and compared to a reference resistance. The resistive value of the resistor 360 may be adjusted or trimmed responsive to the comparison, for example, through laser trimming, by logically switching in resistance segments that use laser fuses, or in flash memory by using flash programmed trim values.

The slave gm cell 320 receives a differential voltage $V_1$, from a voltage source 330, and its transconductance value (gm1) is directly tuned according to the secondary bias 302. In this embodiment, the slave gm cell 320 may have the same or similar topology as the secondary gm cells 222-1 to 222-M (FIG. 2).

As shown above in Equation 1, the voltage $V_2$ across the resistor 360 is equal to the voltage $V_1$ of voltage source 330 multiplied by the transconductance of the slave gm cell 320 and the resistance (1/gm2) of the resistor 360, where the slave gm cell 320 is linear over the voltage range of $V_1$ and $V_2$. When the voltages $V_1$ and $V_2$ are substantially equal the transconductance value (gm2) associated with the resistor 360 is substantially equal to the transconductance value (gm1) of the slave cell 320.

The transconductance tracking control 300 includes a difference unit 340 to determine the difference between the two voltages $V_1$ and $V_2$ and an operational amplifier (op-amp) 350 to generate the secondary bias 302 according to the determined difference. When the secondary bias 302 is a current, the use of op amp 350 may be optional. The secondary bias 302 can adjust the slave gm cell 320 and the secondary gm cells 222-1 to 222-M (FIG. 2) to track the transconductance values associated with the resistor 360.

Figure 4:
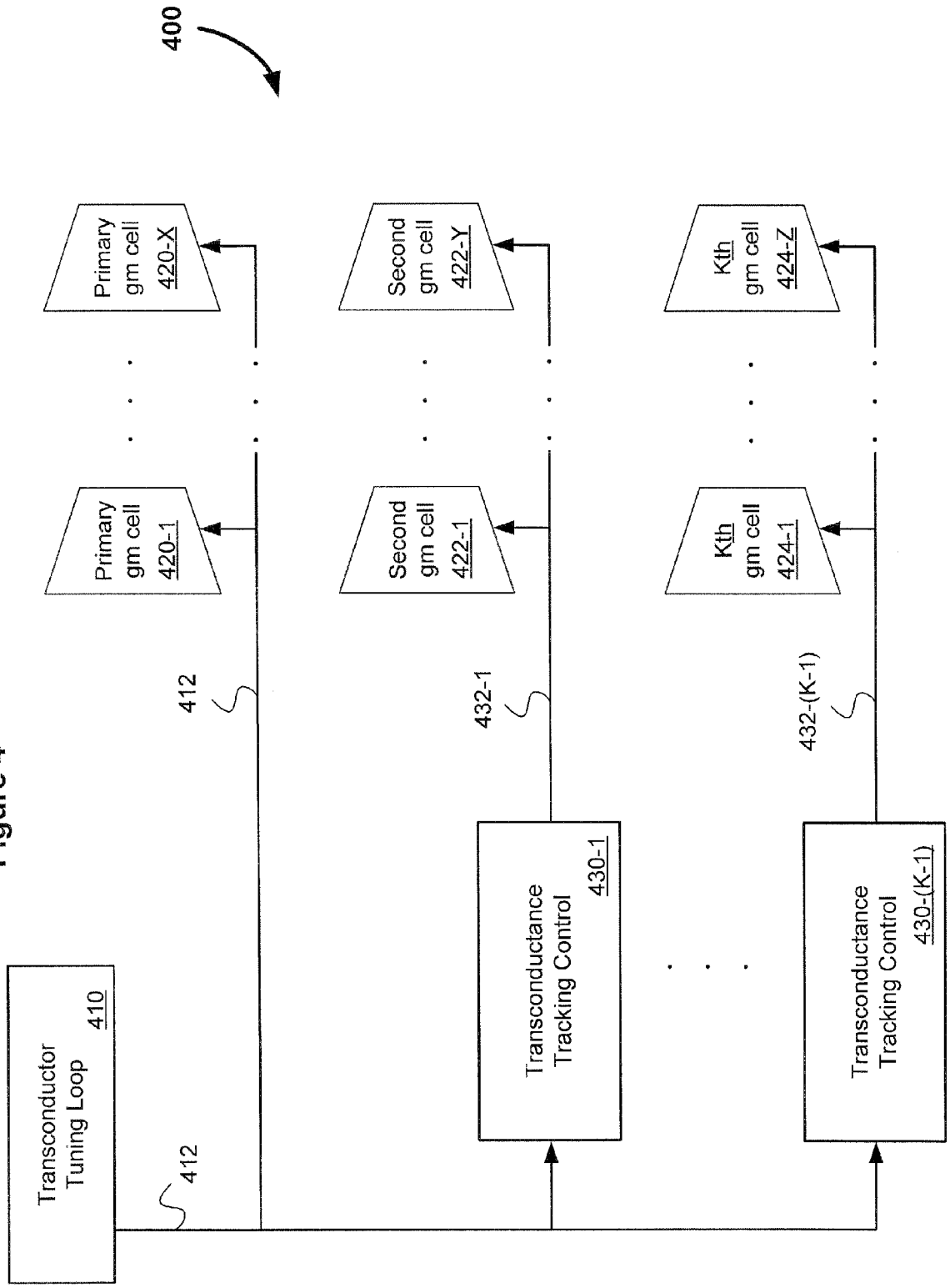
FIG. 4 illustrates, in block form, another system of transconductance cells useful with embodiments of the present invention.

FIG. 4 illustrates, in block form, another system of transconductance cells 400 useful with embodiments of the present invention. Referring to FIG. 4, system 400 illustrates a scalable version of system 200 shown in FIG. 2. The system 400 incorporates a plurality of cell types including primary gm cells 420-1 to 420-X, and secondary gm cells 422-1 to 422-Y through the Kth gm cells 424-1 to 424-Z.

A transconductor tuning loop 410 generates a primary bias 412 to directly adjust the transconductance values of the primary gm cells 420-1 to 420-X. A plurality of transconductance tracking controls 430-1 to 430-(K−1) generates biases 432-1 through 432-(K−1) according to the primary bias 412. These biases 432-1 through 432-(K−1) may be generated similarly to the master-slave embodiments shown in FIG. 3A, where a master gm cell has the same topology as the primary gm cells 420-1 to 420-X and a slave gm cell has the same topology as the corresponding secondary gm cells 422-1 to 422-Y through the Kth gm cells 424-1 to 424-Z. Once generated, the biases 432-1 through 432-(K−1) adjust the transconductance values of the secondary gm cells 422-1 to 422-Y through the Kth gm cells 424-1 to 424-Z, respectively.

In some embodiments, a bias generated by one transconductor tracking control, e.g., 430-1, may be used by one or more other transconductor tracking controls, e.g., 430-2 through 430-(K−1), to generate their corresponding biases, e.g., 432-2 through 324-(K−1). Although transconductance tracking controls 430-1 to 430-(K−1) are shown in FIG. 4 as distinct modules, in some embodiments they may be incorporated into a common control module, or grouped together in a similar fashion. In some embodiments, multiple transconductor tuning loops 410 may be incorporated into system 400 to be used in conjunction with or in lieu of the transconductor tracking controls 430-1 through 430-(K−1).

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. Although the embodiments presented above show differential transconductance cells, a person skilled in the art understands single ended transconductance cells may be incorporated into the systems.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

The invention claimed is:

1. A device comprising:
   a first transconductance cell having a transconductance value that is adjustable responsive to a central tracking signal; and
   a tracking controller including:
   a resistance cell having a resistance value, the tracking controller to generate a secondary tracking signal responsive to the central tracking signal and based, at least in part, on the resistance value, where the secondary tracking signal is adapted to tune one or more second transconductance cells to track the first transconductance cell, where the first and second transconductance cells have different physical topologies and operational characteristics.

2. The device of claim 1 where the secondary tracking signal is adapted to tune the second transconductance cells so both the first and second transconductance cells have substantially the same transconductance value.

3. The device of claim 1 where the tracking controller includes:
   a master transconductance cell having a transconductance value that is set according to the central tracking signal, where the resistance cell is a slave transconductance cell having a transconductance value that is set according to the secondary tracking signal; and
   a tracking signal generator to generate the secondary tracking signal responsive to a voltage difference associated with the master transconductance cell, the secondary tracking signal to adjust the transconductance value associated with a slave transconductance cell so both the master and slave transconductance cells have substantially the same transconductance value.

4. The device of claim 3 where the tracking signal generator includes an operational amplifier to generate the secondary tracking signal responsive to the voltage difference associated with the master transconductance cell.

5. The device of claim 3 where the master transconductance cell is a first transconductance cell and the slave transconductance cell is a second transconductance cell configured with one or more negative feedback loops coupled to the master transconductance cell.

6. The device of claim 1 where the tracking controller includes:
   a master transconductance cell having a transconductance value that is adjustable according to the secondary tracking signal; and
   a tracking signal generator to generate the secondary tracking signal responsive to a voltage difference associated with the master transconductance cell, the secondary tracking signal to adjust the transconductance value associated with the master transconductance cell so the resistance value is substantially equal to the transconductance value associated with the master transconductance cell.

7. The device of claim 1 including another tracking controller to generate a third tracking signal responsive to the central tracking signal, the third tracking signal to adjust one or more third transconductance cells so that the first and third transconductance cells have substantially the same transconductance value.

8. The device of claim 1 including another tracking controller to generate a third tracking signal responsive to the secondary tracking signal, the third tracking signal to adjust one or more third transconductance cells so that the second and third transconductance cells have substantially the same transconductance value.

9. A method comprising:
   receiving a primary bias signal from a centralized tuner, the primary bias signal to tune one or more first transconductance cells; and
   generating a secondary bias signal responsive to the primary bias signal, the secondary bias signal to tune one or more second transconductance cells to track the tuning of the first transconductance cells, where the first and second transconductance cells have different physical topologies and operational characteristics;
   applying an input voltage to a master transconductance cell coupled to a resistance cell;
   determining a difference between the input voltage and a voltage associated with the resistance cell; and
   generating the secondary bias signal responsive to the determining.

10. The method of claim 9 where the secondary bias signal is adapted to tune the second transconductance cells so both the first and second transconductance cells have substantially the same transconductance value.

11. The method of claim 9 includes generating a third bias signal responsive to the primary bias signal, the third bias signal to tune one or more third transconductance cells to track the tuning of the first transconductance cells.

12. The method of claim 9 includes generating a third bias signal responsive to the secondary bias signal, the third bias signal to tune one or more third transconductance cells to track the tuning of the second transconductance cells.

13. The method of claim 9 includes:
   applying the input voltage to the master transconductance cell coupled to the resistance cell, where the resistance cell is a slave transconductance cell having one or more negative feedback loops;
   determining a difference between the input voltage and a voltage associated with the slave transconductance cell; and
   generating the secondary bias signal responsive to the determining.

14. A device comprising:
   means for receiving a primary bias signal from a centralized tuner, the primary bias signal to tune one or more first transconductance cells; and
   means for generating a secondary bias signal responsive to the primary bias signal, the secondary bias signal to tune one or more second transconductance cells to track the tuning of the first transconductance cells, where the first and second transconductance cells have different physical topologies and operational characteristics and, where the means for generating includes means for applying an input voltage to a master transconductance cell coupled to a resistance cell, means for determining a difference between the input voltage and a voltage associated with the resistance cell, and means for generating the secondary bias signal responsive to the determining.

15. The device of claim 14 where the secondary bias signal is adapted to tune the second transconductance cells so both the first and second transconductance cells have substantially the same transconductance value.

16. The device of claim 14 including means for generating a third bias signal responsive to the primary bias signal, the third bias signal to tune one or more third transconductance cells to track the tuning of the first transconductance cells.

17. The device of claim 15 including means for generating a third bias signal responsive to the secondary bias signal, the third bias signal to tune one or more third transconductance cells to track the tuning of the second transconductance cells.

18. The device of claim 14 where the means for generating includes:
   means for applying the input voltage to the master transconductance cell, where the resistance cell is a slave transconductance cell having one or more negative feedback loops;
   means for determining a difference between the input voltage and a voltage associated with the slave transconductance cell; and
   means for generating the secondary bias signal responsive to the determining.

* * * * *